United States Patent [19]

Honda et al.

[11] Patent Number: 4,629,547

[45] Date of Patent: Dec. 16, 1986

[54] PROCESS FOR FORMING PROTECTIVE FILM OF ORGANIC POLYMER AND BORON

[75] Inventors: Yoshinori Honda; Makoto Kitoo; Yuuichi Kokaku, all of Yokohama, Japan

[73] Assignee: Hitachi, Ltd., Tokyo, Japan

[21] Appl. No.: 671,918

[22] Filed: Nov. 15, 1984

[30] Foreign Application Priority Data

Nov. 16, 1983 [JP] Japan .................................. 58-214017

[51] Int. Cl.$^4$ ........................ C23C 14/12; C23C 14/18
[52] U.S. Cl. ............................................... 204/192.15
[58] Field of Search ........ 204/192 C, 192 SP, 192 M, 204/192 D; 428/692, 900

[56] References Cited

U.S. PATENT DOCUMENTS

| 3,583,899 | 6/1971 | Aronson | 204/192 C |
| 4,390,601 | 6/1983 | Ono et al. | 204/192 SP |
| 4,525,417 | 6/1985 | Dimigen et al. | 204/192 SP |

Primary Examiner—Howard S. Williams
Attorney, Agent, or Firm—Antonelli, Terry & Wands

[57] ABSTRACT

A protective film having a very low coefficient of friction, a good wear resistance, a good adhesion, and prolonged lubricating and moisture-resistant properties is formed on a substrate by sputtering of a target consisting of at least one of organic polymers and at least one of boron compounds.

20 Claims, 7 Drawing Figures

FIG. 1-1   FIG. 1-2   FIG. 1-3
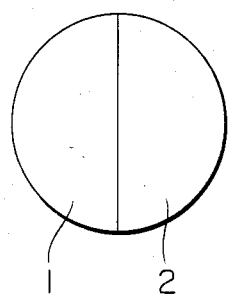 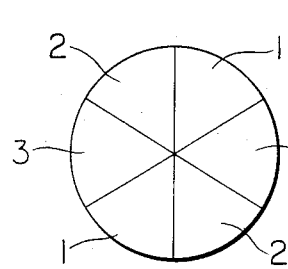 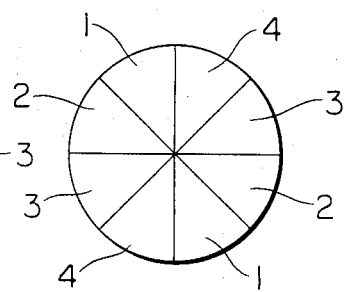
FIG. 2-1   FIG. 2-2
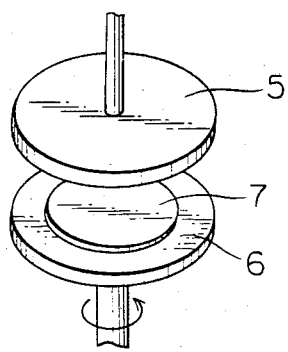 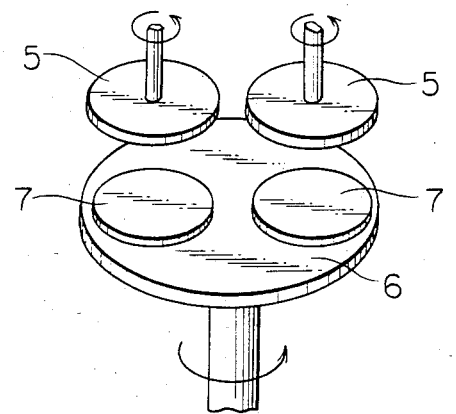

PROCESS FOR FORMING PROTECTIVE FILM OF ORGANIC POLYMER AND BORON

BACKGROUND OF THE INVENTION

This invention relates to a process for forming a protective film, and more particularly to a process for forming a protective film on a magnetic recording layer.

DESCRIPTION OF THE PRIOR ART

Recording media such as magnetic discs, magnetic tapes, video discs, audio discs, etc. require the presence of lubricating oil or solid lubricating layer having a thickness of 10 to 10,000 Å and a resistance to head rubbing on their surfaces. Such a thin film can be formed by depositing a monomolecular layer of metal soap, etc. by dipping, or depositing a polymer film onto a substrate by plasma polymerization of monomers, or depositing a protective film by sputtering of polyimide resin (Japanese Patent Publication No. 57-116771). Among these processes, the process for forming a protective film by sputtering has been regarded as being effective for various members to be protected in view of its simplicity and film uniformity. However, it has been found that the protective film obtained by sputtering of polyimide resin in an inert gas has a high coefficient of friction and a poor wear resistance. Furthermore, it has been found that, when these protective films are used as moisture-resistant protective films for metallic conductors, semiconductors, ceramic substrates, etc., they have a poor moisture resistance owing to weak adhesion to the members to be protected.

SUMMARY OF THE INVENTION

An object of the present invention is to overcome the said disadvantages of the prior art and to provide a process for forming a protective film having a low coefficient of friction, a high wear resistance, a good adhesion and a good moisture resistance.

BRIEF DESCRIPTION OF THE DRAWINGS

FIG. 1 shows embodiments of targets for use in the present invention.

FIG. 2 shows embodiments of electrode structures.

DETAILED DESCRIPTION OF THE PREFERRED EMBODIMENTS

Figure 3:
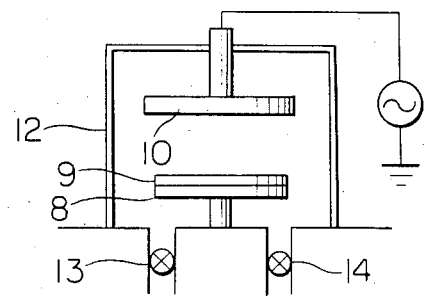
FIG. 3 is a schematic view of a sputtering apparatus.

As a result of extensive studies of protective films, the present inventors have found that, so far as the target materials for use in sputtering are organic polymers, there are limits to the wear resistance, coefficient of friction, adhesion, etc. as requisites for protective film properties, and a boron compound can improve the said properties in various target materials. Furthermore, it has been found that the boron compound alone forms a brittle film with a poor impact resistance, which is broken by contact impact with a head.

The present invention is based on the foregoing findings, and provides a process for forming a protective film of organic polymer by sputtering, characterized in that the target material comprises at least one of organic polymers and at least one of boron compounds. According to the present invention, a protective film having a very low coefficient of friction, prolonged lubricating and moisture-resistant properties and good physical and chemical properties can be obtained.

The organic polymer for use in the present invention as a target material includes thermo-setting resins, for example, phenol resin, furan resin, xyleneformaldehyde resin, urea resin, melamine resin, aniline resin, alkyd resin, unsaturated polyester resin, epoxy resin, thermo-setting polyurethane resin, polyimide resin, etc. and thermoplastic resins, for example, polyethylene, poly-p-xylylene, polyvinyl acetate, polyacrylate, polymethacrylate, polyvinyl chloride, polyvinylidene chloride, polyacrylonitrile, polyvinyl ether, polyvinyl ketone, polyether, polycarbonate, fluororesin, thermoplastic polyester, polyamide, dienic plastics, thermoplastic polyurethane, etc., and they can be used alone or in a mixtue of two or more. Among others, thermo-setting resins such as phenol resin, melamine resin, unsaturated polyester resin, epoxy resin, polyimide resin, etc., and thermoplastic resins such as polyvinyl acetate, polyvinyl chloride, polyvinylidene chloride, polyamide, fluororesin, etc. are preferable as the target materials.

These polymers can be used in their combinations, and the following combinations as the target material are possible, for example, combinations of thermo-setting resins themselves, thermoplastic resins themselves, and a thermo-setting resin and a thermoplastic resin, and particularly the following combinations are preferable: combinations of thermo-setting resins themselves such as phenol resin-epoxy resin, epoxy resin-polyimide resin, and phenol resin-polyimide resin; combinations of thermoplastic resins themselves such as polyvinyl chloride-polyvinylidene chloride, polyamide-polyvinylidene chloride, and polyamide-fluororesin; combinations of a thermo-setting resin and a thermoplastic resin such as phenol resin-polyvinylidene chloride, epoxy resin-polyamide, polyamide-phenol resin, phenol resin-fluororesin, epoxy resin-fluororesin, polyimide resin-fluororesin, polyimide resin-polyamide resin, and polyimide resin-polyvinylidene chloride. Furthermore, combinations of three members such as epoxy resin-polyamide resin-polyimide resin are also possible.

The boron compound for use in the present invention includes borides, for example, $Ta_2B$, $Mo_2B$, $W_2B$, $Mn_2B$, $CrB_2$, $NbB$, $MoB$, $CoB$, $MnB$, $WB$, $TaB$, $Ta_3B_4$, $Nb_3B_4$, $Mn_3B_4$, $AlB_2$, $MgB_2$, $TiB_2$, $CeB_4$, $YB_4$, $CaB_6$, $BaB_6$, $NaB_4$, $ZrB_{12}$, etc.; boric acids, for example, $H_3BO_3$, $H_2B_4O_7$, $HBO_2$, etc.; boric acid esters; borates; boron nitride; boron oxides, for example, $B_2O_5$, $B_4O_3$, $B_4O_5$, etc., and they can be used alone or in a mixture of two or more. Among others, $AlB_2$, $TiB_2$, $CrB_2$, $B_2O_3$, and boron nitride are preferable. Effective combinations of two or more members are combinations of $AlB_2$—$B_2O_3$, boron nitride-$CrB_2$, $TiB_2$—$B_2O_3$, boron nitride-$B_2O_3$—$TiB_2$, etc.

Atmosphere gas for use in the sputtering according to the present invention includes an inert gas such as He, Ne, Ar, Kr, Xe, etc. or a gas mixture thereof with at least one of reacting gases such as $O_2$, $N_2$, $H_2$, etc. Preferable gas mixture of the inert gas with the reacting gas are $Ar+O_2$, $AR+N_2$, $Ar+H_2$ and $Ar+N_2+H_2$, where it is effective that 1 to 10% by volume of the reacting gas is contained on the basis of Ar. The effects of the reacting gas are, for example, in the case of $O_2$, promotion to carbonize the sputtered film of organic polymer, in the case of $N_2$, incorporation of $N_2$ in the form of $C\equiv N$, $NH_2$, etc. into the sputtered film of organic polymer, and an increase in the heat resistance and adhesion, and, in the case of $H_2$, occasioning of reaction of $CH_2$, CH, etc. to prevent oxidation of sputtered film and ensure stabilization.

Well known sputtering procedures such as sputtering by glow discharge under direct current, low frequency, high frequency (RF), microwave, etc., by ion beam sputtering, etc. are applicable to the present invention. Among others, parallel electrode type RF sputtering and magnetron type RF sputtering are preferable. In case of RF sputtering, sputtering can be carried out at a discharge power of 0.01 to 70 $W/cm^2$, preferably 0.1–20 $W/Cm^2$. Any pressure of atmosphere gas can be used, so long as glow discharge can be obtained, and the desirable pressure is $10^{-4}$ to 1 Torr.

Target shape and sputtering procedure for using at least two of organic polymer targets or boron compounds in the present invention are shown in FIGS. 1-1 to 1-3 and FIGS. 2-1 to 2-2, where at least one each of organic polymer and boron compound are integrated. Their embodiments are shown in FIGS. 1-1 to 1-3.

In FIG. 1, target materials are provided in equal portions. For example, in FIG. 1-1, a combination of organic polymer A 1 and boron compound A 2 is shown. In FIG. 1-2, a combination of organic polymer A 1, boron compound A 2 and organic polymer B 3 or boron compound B 3 is shown. In FIG. 1-3, a combination of organic polymer A 1, a boron compound A 2, organic polymer B 3 or boron compound B 3, and organic polymer C 4 or boron compound C 4 is shown. When the target material members are increased, the number of portions must be corresponding increased. Even in case of the number of target material members is 2 to 4, an increased number of portions can be used.

In the present invention, similar effect can be obtained by dispersing the boron compound in the organic polymer besides the said division of target material members in equal portions.

FIG. 2 schematically shows an electrode structure for mixtue or multilayer sputtering. In FIG. 2-1, target shown in FIGS. 1-1 to 1-3 is provided on target electrode 5, and target materials can be deposited on a substrate 7 on a substrate electrode 6 in a desired thickness while rotating the substrate 7 through the substrate electrode 6. In FIG. 2-2, targets shown in FIGS. 1-1 to 1-3 are each provided on target electrodes 5 and at least two film layers are formed by changing the positions of substrate electrode 6 by turning to 180°. Similar mixing as in FIG. 2-1 can be obtained with the apparatus of FIG. 2-2.

Embodiments of the present invention will be described in detail below.

FIG. 3 shows a schematic view of a sputtering apparatus for use in the present invention, where numeral 8 is a substrate on which a magnetic recording layer 9, on which a protective film is to be formed, is provided; 12 is a chamber, 13 an evacuating valve, and 14 is a valve for introducing an atmosphere gas.

Figure 4:
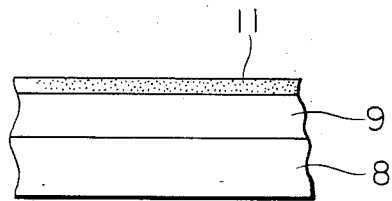
FIG. 4 is a schematic cross-sectional view of a magnetic recording medium, where a protective film is provided on a magnetic recording layer on a substrate.

FIG. 4 is a schematic cross-sectional view of a protective film 11-provided magnetic recording layer 9 on a substrate 8 according to the present invention.

In the present embodiments, a protective film is formed as follows:

A magnetic recording layer 9 (e.g. $\alpha$—$Fe_2O_3$) provided on a substrate 8 (Si wafer, 3 inches in diameter) is used as an anode, and protective film materials (organic polymer and boron compound) are used as a cathode. Inside of chamber 12 is evacuated to less than $1 \times 10^{-4}$ Torr, and then an atmosphere gas (Ar, $AR + O_2$, $Ar + N_2$, $Ar + H_2$, or $Ar + N_2 + H_2$) is introduced into the chamber, and the gas pressure is fixed to $1 \times 10^{-3}$ to 0.5 Torr. Then, glow discharging is carried out under a high frequency (13.56 MHz) with a discharge power of 0.1 to 60 $W/cm^2$ to form a protective film 11 on the magnetic recording layer 9. The wear resistance, coefficient or friction and adhesivity are measured.

Combinations of organic polymer and boron compound used are shown below:
1. Fluororesin with boron nitride, $B_2O_3$, $AlB_3 + B_2O_3$, and boron nitride + $B_2O_3$ + $TiB_2$
2. Polyimide resin with boron nitride, $TiB_2 + B_2O_3$, and boron nitride + $B_2O_3$ + $TiB_2$
3. Epoxy resin + phenol resin with boron nitride, boron nitride + $CrB_2$ and $TiB_2 + B_2O_3$
4. Polyamide resin + polyimide resin + fluororesin with boron nitride, $TiB_2 + B_2O_3$, boron nitride + $CrB_2$, $CrB_2$ and $AlB_2$ The results of measurement are shown in the following Table as Tests Nos. 1 to 46. The ratio of boron compound (referred to as "B") is shown by area ratio of B/A on target where A refers to organic polymer.

As shown in Table, the protective films formed according to the present invention (Tests Nos. 1 to 45) have 1 to 10-fold wear resistance, $\frac{1}{2}$-1/10-fold coefficient or friction, and 2–5-fold adhesivity, as compared with the conventional protective film (Test No. 46).

TABLE

| Test No. | Target material Organic polymer | Target material Boron compound | B/A* | Reacting gas added (%) | Gas pressure** (Torr) | Discharge power ($W/cm^2$) | Film thickness (Å) | Coefficient of friction (against sapphire) | Wear resistance (Pass) | Adhesivity ($Kg/cm^2$) |
|---|---|---|---|---|---|---|---|---|---|---|
| 1 | Fluoro- | BN | 1/1 | — | $1 \times 10^{-1}$ | 20 | 500 | 0.03 | 3000 | 5 |
| 2 | resin | | 1/2 | — | $1 \times 10^{-2}$ | 20 | 500 | 0.01 | 5000 | 5 |
| 3 | | $B_2O_3$ | 1/1 | $H_2$ 1% | $3 \times 10^{-2}$ | 40 | 500 | 0.05 | 3000 | 5 |
| 4 | | | 1/2 | — | $5 \times 10^{-2}$ | 40 | 500 | 0.05 | 5000 | 5 |
| 5 | | $AlB_2 + B_2O_3$ | 1/2 | — | $1 \times 10^{-1}$ | 25 | 500 | 0.03 | 6000 | 7 |
| 6 | | | 1/1 | O | $1 \times 10^{-1}$ | 30 | 500 | 0.03 | 6500 | 7 |
| 7 | | | 2/1 | $N_2$ 2% | $1 \times 10^{-2}$ | 40 | 500 | 0.01 | 3500 | 7 |
| 8 | | $BN + B_2O_3 +$ | 1/1 | — | $4 \times 10^{-2}$ | 40 | 500 | 0.02 | 3000 | 7 |
| 9 | | $TiB_2$ | 1/2 | — | $4 \times 10^{-2}$ | 20 | 500 | 0.05 | 3200 | 7 |
| 10 | | | 1/4 | — | $4 \times 10^{-2}$ | 10 | 500 | 0.05 | 4500 | 5 |
| 11 | | | 2/1 | $N_2$ 2% | $5 \times 10^{-2}$ | 60 | 500 | 0.01 | 2300 | 5 |
| 12 | Polyimide | BN | 1/1 | $N_2 + H_2$ 5% | $1 \times 10^{-3}$ | 10 | 500 | 0.02 | 10000 | 10 |
| 13 | resin | | 1/2 | $N_2 + H_2$ 5% | $5 \times 10^{-3}$ | 5 | 500 | 0.01 | 5000 | 11 |
| 14 | | | 1/4 | — | $1 \times 10^{-2}$ | 2 | 500 | 0.05 | 3500 | 5 |
| 15 | | $TiB_2 + B_2O_3$ | 2/1 | $H_2$ 5% | $5 \times 10^{-2}$ | 2 | 500 | 0.02 | 5700 | 12 |
| 16 | | | 1/1 | — | $2 \times 10^{-2}$ | 2 | 500 | 0.05 | 3300 | 7 |
| 17 | | $BN + B_2O_3 +$ | 4/1 | — | $1 \times 10^{-2}$ | 20 | 500 | 0.02 | 2000 | 8 |

TABLE-continued

| Test No. | Target material Organic polymer | Boron compound | B/A* | Reacting gas added (%) | Gas pressure** (Torr) | Discharge power (W/cm$^2$) | Film thickness (Å) | Coefficient of friction (against sapphire) | Wear resistance (Pass) | Adhesivity (Kg/cm$^2$) |
|---|---|---|---|---|---|---|---|---|---|---|
| 18 | | TiB$_2$ | 2/1 | — | $1 \times 10^{-2}$ | 10 | 500 | 0.02 | 2000 | 8 |
| 19 | | | 1/1 | — | $1 \times 10^{-2}$ | 5 | 500 | 0.05 | 2700 | 10 |
| 20 | | | 1/2 | — | $1 \times 10^{-2}$ | 2 | 500 | 0.05 | 5000 | 10 |
| 21 | | | 1/1 | N$_2$ 1% | $4 \times 10^{-2}$ | 5 | 500 | 0.08 | 7500 | 12 |
| 22 | | | 1/1 | N$_2$ 5% | $4 \times 10^{-2}$ | 5 | 500 | 0.08 | 11000 | 12 |
| 23 | | | 1/1 | N$_2$ 7% | $4 \times 10^{-2}$ | 5 | 500 | 0.08 | 8900 | 9 |
| 24 | Epoxy resin + | BN | 1/1 | — | $1 \times 10^{-3}$ | 0.5 | 300 | 0.05 | 3700 | 5 |
| 25 | phenol | | 1/2 | — | $2 \times 10^{-2}$ | 2 | 300 | 0.05 | 10000 | 5 |
| 26 | resin | | 1/1 | N$_2$ + H$_2$ 2% | $3 \times 10^{-2}$ | 5 | 300 | 0.10 | 5000 | 7 |
| 27 | | | 1/1 | N$_2$ 3% | $5 \times 10^{-2}$ | 5 | 300 | 0.10 | 4700 | 7 |
| 28 | | BN + CrB$_2$ | 2/1 | — | $1 \times 10^{-2}$ | 10 | 300 | 0.02 | 5000 | 10 |
| 29 | | | 1/1 | — | $1 \times 10^{-2}$ | 10 | 300 | 0.02 | 3200 | 10 |
| 30 | | | 1/2 | — | $1 \times 10^{-2}$ | 10 | 300 | 0.05 | 3000 | 7 |
| 31 | | | 1/1 | O$_2$ 1% | $5 \times 10^{-3}$ | 15 | 300 | 0.05 | 4700 | 7 |
| 32 | | | 1/1 | O$_2$ 5% | $5 \times 10^{-3}$ | 20 | 300 | 0.10 | 7200 | 5 |
| 33 | | TiB$_2$ + B$_2$O$_3$ | 1/4 | — | $2 \times 10^{-2}$ | 5 | 300 | 0.07 | 5000 | 7 |
| 34 | | | 1/2 | — | $2 \times 10^{-2}$ | 5 | 300 | 0.07 | 7200 | 5 |
| 35 | | | 1/1 | — | $2 \times 10^{-2}$ | 5 | 300 | 0.08 | 6500 | 5 |
| 36 | Polyamide + | BN | 1/1 | N$_2$ 1% | $5 \times 10^{-2}$ | 10 | 300 | 0.02 | 11000 | 10 |
| 37 | polyimide | | 1/2 | N$_2$ 1% | $5 \times 10^{-2}$ | 10 | 300 | 0.02 | 8000 | 10 |
| 38 | resin + | TiB$_2$ + B$_2$O$_3$ | 1/1 | — | $1 \times 10^{-2}$ | 10 | 300 | 0.03 | 4700 | 8 |
| 39 | fluoro- | | 1/2 | — | $1 \times 10^{-2}$ | 20 | 300 | 0.05 | 1800 | 5 |
| 40 | resin | BN + CrB$_2$ | 1/1 | N$_2$ 2% | $7 \times 10^{-3}$ | 40 | 300 | 0.12 | 7200 | 6 |
| 41 | | | 1/2 | — | $5 \times 10^{-2}$ | 40 | 300 | 0.11 | 4500 | 6 |
| 42 | | CrB$_2$ | 1/1 | O$_2$ 1% | $4 \times 10^{-2}$ | 7 | 300 | 0.08 | 8500 | 9 |
| 43 | | | 1/2 | — | $1 \times 10^{-2}$ | 10 | 300 | 0.08 | 9700 | 11 |
| 44 | | AlB$_2$ | 1/1 | N$_2$ + H$_2$ 2% | $2 \times 10^{-2}$ | 20 | 300 | 0.10 | 4850 | 5 |
| 45 | | | 1/2 | — | $2 \times 10^{-2}$ | 5 | 300 | 0.05 | 5000 | 5 |
| 46 | Polyimide*** | — | — | — | $1 \times 10^{-2}$ | 7 | 300; 500 | 0.35 | 1000–1500 | 2.5 |

*B/A = area ratio of boron compound/organic polymer
**Total gas pressure of Ar + reacting gas, where Ar is used as an inert gas base.
***Prior art

What is claimed is:

1. A process for forming a protective film which comprises conducting sputtering between an electrode provided with a substrate on which a protective film is to be formed and an electrode provided with a target consisting of at least one organic polymer and at least one boron compound in a vacuum chamber filled with a small amount of an inert gas, thereby forming a protective film containing the organic polymer and the boron compound together on the substrate, said protective film having an improved coefficient of friction as compared with that of a film of the organic polymer itself.

2. A process according to claim 1, wherein the organic polymer is at least one selected from the group consisting of thermo-setting resins and thermoplastic resins.

3. A process according to claim 2, wherein the organic polymer is at least one selected from the group consisting of phenol resin, furan resin, xylene-formaldehyde resin, urea resin, melamine resin, aniline resin, alkyd resin, thermo-setting unsaturated polyester resin, epoxy resin, thermo-setting polyurethane resin, polyimide resin, polyethylene, poly-p-xylylene, polyvinyl acetate, polyvinyl chloride, polyvinylidene chloride, polyacrylonitrile, polyvinyl ether, polyvinyl ketone, polyether, polycarbonate, fluororesin, thermoplastic polyester, polyamide, dienic plastics, and thermoplastic polyurethane.

4. A process according to claim 3, wherein the organic polymer is selected from the group consisting of thermoplastic polyacrylate resin and thermoplastic polymethacrylate resin.

5. A process according to claim 3, wherein the boron compound is at least one selected from the group consisting of Ta$_2$B, Mo$_2$B, W$_2$B, Mn$_2$B, CrB$_2$, NbB, MoB, CoB, MnB, WB, TaB, Ta$_3$B$_4$, Nb$_3$B$_4$, Mn$_3$B$_4$, AlB$_2$, MgB$_2$, TiB$_2$, CeB$_4$, YB$_4$, CaB$_6$, BaB$_6$, NaB$_4$, ZrB$_{12}$, H$_3$BO$_3$, H$_2$B$_4$O$_7$, HBO$_2$, B$_2$O$_3$, B$_4$O$_3$ and B$_4$O$_5$.

6. A process according to claim 1, wherein the boron compound is at least one selected from the group consisting of borides, boric acids, boric acid esters, borates, boron oxides, and boron nitride.

7. A process according to claim 4, wherein the boron compound is at least one selected from the group consisting of Ta$_2$B, Mo$_2$B, W$_2$B, Mn$_2$B, CrB$_2$, NbB, MoB, CoB, MnB, WB, TaB, Ta$_3$B$_4$, Nb$_3$B$_4$, Mn$_3$B$_4$, AlB$_2$, MgB$_2$, TiB$_2$, CeB$_4$, YB$_4$, CaB$_6$, BaB$_6$, NaB$_4$, ZrB$_{12}$, H$_3$BO$_3$, H$_2$B$_4$O$_7$, HBO$_2$, B$_2$O$_3$, B$_4$O$_3$ and B$_4$O$_5$.

8. A process according to claim 1, wherein the substrate is a recording medium provided with a magnetic recording layer.

9. A process according to claim 1, wherein the electrodes are rotatable electrodes.

10. A process according to claim 1, wherein the sputtering is carried out by glow discharge under application of direct current, low frequency, high frequency or microwaves.

11. A process according to claim 1, wherein the sputtering is carried out by glow-discharge under high frequency with a discharge power of 0.01 to 70 W/cm$^2$.

12. A process according to claim 1, wherein the target is an integration of at least one of the organic polymers and at least one of the boron compounds.

13. A process according to claim 1, wherein the small amount of the inert gas is He, Ne, Ar, Kr or Xe under a pressure of $10^{-4}$ to 1 Torr.

14. A process according to claim 1, wherein the small amount of the inert gas consists of 90 to 99% by volume of He, Ne, Ar, Kr, or Xe, and 10 to 1% by volume of at least one of $O_2$, $N_2$ and $H_2$ under a pressure $10^{-4}$ to 1 Torr.

15. A process according to claim 1, wherein said organic polymer is a combination of polymers selected from the group consisting of phenol resin-epoxy resin, epoxy resin-polyimide resin, phenol resin-polyimide resin, polyvinyl chloride-polyvinylidene chloride, polyamide-polyvinylidene chloride, polyamide-fluororesin, phenol resin-polyvinylidene chloride, epoxy resin-polyamide, polyamide-phenol resin, phenol resin-fluororesin, epoxy resin-fluororesin, polyimide resin-fluororesin, polyimide resin-polyamide resin, polyimide resin-polyvinylidene chloride, and epoxy resin-polyamide resin-polyimide resin.

16. A process according to claim 1, wherein the boron compound is a combination of compounds selected from the group consisting of $AlB_2$—$B_2O_3$, boron nitride-$CrB_2$, $TiB_2$—$B_2O_3$, and boron nitride-$B_2O_3$—$TiB_2$.

17. A process according to claim 1, wherein the organic polymer is at least one selected from the group consisting of phenol resin, melamine resin, thermo-setting unsaturated polyester resin, epoxy resin, polyimide resin, polyvinyl acetate, polyvinyl chloride, polyvinylidene chloride, polyamide, and fluororesin.

18. A process according to claim 1, wherein the boron compound is at least one selected from the group consisting of $AlB_2$, $TiB_2$, $CrB_2$, $B_2O_3$ and boron nitride.

19. A process according to claim 1, wherein the target comprises the boron compound dispersed in the organic polymer.

20. A process according to claim 1, wherein the target comprises portions of the organic polymer and portions of the boron compound integrated so as to form a target member.

* * * * *